United States Patent
Huang et al.

(10) Patent No.: US 6,501,525 B2
(45) Date of Patent: Dec. 31, 2002

(54) METHOD FOR INTERCONNECTING A FLAT PANEL DISPLAY HAVING A NON-TRANSPARENT SUBSTRATE AND DEVICES FORMED

(75) Inventors: Yuan-Chang Huang, Shinjuang (TW); Tai-Hong Chen, Shijr (TW)

(73) Assignee: Industrial Technology Research Institute, Hsin Chu (TW)

( * ) Notice: Subject to any disclaimer, the term of this patent is extended or adjusted under 35 U.S.C. 154(b) by 199 days.

(21) Appl. No.: 09/732,863

(22) Filed: Dec. 8, 2000

(65) Prior Publication Data

US 2002/0071085 A1 Jun. 13, 2002

(51) Int. Cl.[7] .............................................. G02F 1/1335
(52) U.S. Cl. ...................... 349/150; 379/152; 379/149
(58) Field of Search ............................. 349/149, 150, 349/152

(56) References Cited

U.S. PATENT DOCUMENTS

| | | | |
|---|---|---|---|
| 4,600,273 A | * 7/1986 | Ohno ............................ | 349/149 |
| 5,270,848 A | * 12/1993 | Takabayashi et al. ......... | 349/152 |
| 5,510,918 A | * 4/1996 | Matsunaga et al. ........... | 349/149 |
| 5,519,524 A | * 5/1996 | Fergason et al. ............. | 349/149 |
| 5,880,795 A | 3/1999 | Nagata et al. | |
| 6,005,649 A | 12/1999 | Krusius et al. | |

* cited by examiner

*Primary Examiner*—James Dudek
(74) *Attorney, Agent, or Firm*—Tung & Associates (57) ABSTRACT

A method for simultaneously forming a flat display panel and bonding to a printed circuit board is disclosed in which a silicon wafer is first supplied and then coated with an alignment layer, a multiplicity of spacers are then mounted to the wafer before it is severed into a multiplicity of dies. A frame seal is then applied to the periphery of the die, while a multiplicity of metal leads is formed on the die for electrical communication with a multiplicity of thin film transistors. A glass plate is then assembled to the silicon substrate by the frame seal, while simultaneously bonded to a printed circuit board in a bonder apparatus under pressure by utilizing a conductive material such as silver paste, an anisotropic conductive film or an isotropic conductive adhesive. The bonding of the printed circuit board to the flat panel display module occurs simultaneously with the formation of interconnections between the printed circuit board and the multiplicity of metal leads on the silicon substrate through a multiplicity of transparent electrodes formed on the glass plate of the flat panel display. The present invention novel structure allows the use of a conventional alignment apparatus such as CCD for optical alignment and a conventional bonder apparatus since a glass substrate is completely exposed and optical transmission can be achieved through the flat panel display module.

20 Claims, 4 Drawing Sheets

METHOD FOR INTERCONNECTING A FLAT PANEL DISPLAY HAVING A NON-TRANSPARENT SUBSTRATE AND DEVICES FORMED

FIELD OF THE INVENTION

The present invention generally relates to a method for interconnecting a flat panel display and a device formed and more particularly, relates to a method for interconnecting a liquid crystal display panel to a printed circuit board wherein the display panel has a non-transparent substrate and a device formed by the method.

BACKGROUND OF THE INVENTION

In recent years, liquid crystal display (LCD) panels have been used widely in place of cathode ray tubes (CRT) in electronic display applications. The LCD panel is first assembled together by filling a liquid crystal material in-between a LCD substrate and a transparent glass cover plate. The LCD substrate consists of a multiplicity of switching, or electronic turn-on and turn-off devices for operating the multiplicity of pixels formed on the LCD panel.

Figure 1A:
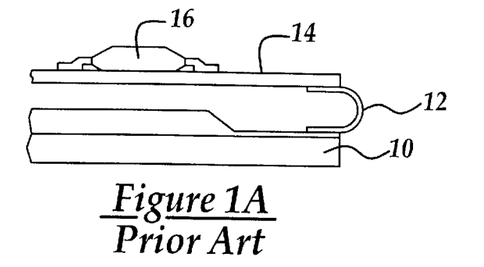
FIG. 1A is a graph illustrating a conventional surface mount type integrated circuit bonded to a printed circuit board and connected to a liquid crystal display panel by a flexible printed circuit board.

After the assembly of a LCD panel is completed, the panel must be connected to an outside circuit for receiving electronic signals such that images may be produced in the panel. The electronic connections to the LCD panel can be provided by different techniques. A conventional technique for providing electronic signals to a LCD panel is by using a flexible printed circuit board (FPCB) which contains various electronic components welded thereto for providing signals to the LCD. The flexible printed circuit board is frequently manufactured of a conductive copper layer sandwiched between two flexible polyimide cover layers. The flexibility of FPCB is advantageous in the installation of a LCD panel. FIG. 1A is a graph illustrating a conventional design of LCD panel 10 connected by a FPCB 12 to a printed circuit board (PCB) 14 which has a surface mount technology (SMT) type IC chip 16 mounted on top.

Figure 1B:
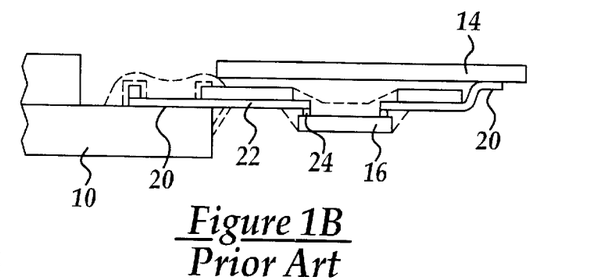
FIG. 1B is a graph illustrating a conventional method for using a tape automated bonding (TAB) tape for connecting a liquid crystal display panel to a printed circuit board.

In another conventional technique for bonding a LCD to a PCB, as shown in FIG. 1B, a tape automated bonding (TAB) technique is used. In the TAB bonding technique, a TAB section 20 is used to connect LCD 10 and PCB 14. The TAB section 20 consists of a TAB tape 22 which has an IC chip 16 connected to it through bonding sites 24. The TAB bonding technique provides the benefit of a compact package so that circuit density can be improved resulting in a lead pitch as low as 60 µm. The TAB, also known as TCP (tape carrier package) utilizes finely patterned thin metal, i.e., copper foil plated with Au or Sn, in place of wires and connects the metal tips metallurgically to corresponding gold plated bumps that are formed on the aluminum pads on the chip. TAB is preferred in smaller-pitch interconnects for high I/O ULSI devices because it enables smaller pitch and longer span bondings than those available by wire bonding. However, the TAB bonding technique is normally conducted at a higher fabrication cost.

Figure 1C:
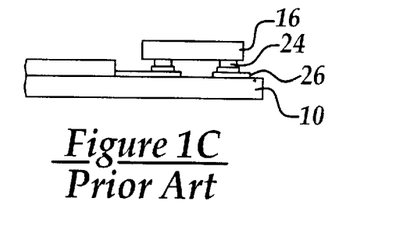
FIG. 1C is a graph illustrating a conventional chip-on-glass (COG) technique for connecting an integrated circuit chip to a liquid crystal display substrate.
Figure 2A:
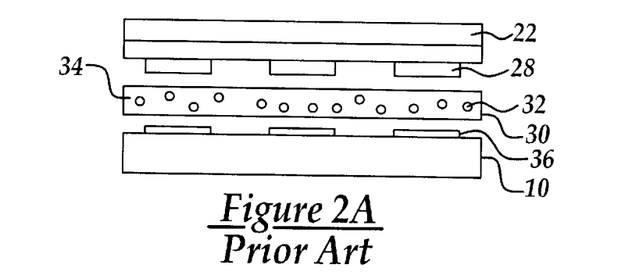
FIG. 2A is a graph illustrating a method for bonding a TAB tape to a liquid crystal display substrate by an isotropic conductive film.
Figure 2B:
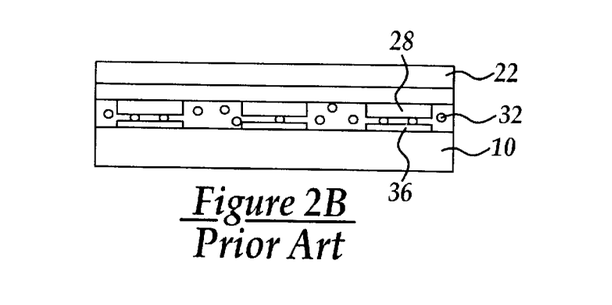
FIG. 2B is a graph illustrating the components of FIG. 2A after compressed together under heat and electrical communication between the TAB tape and the liquid crystal display substrate is established.

In still another technique for bonding a LCD to a PCB, as shown in FIG. 1C, a chip on glass (COG) technique is used. In the COG technique, an IC chip 16 is mounted directly on a LCD 10 by utilizing solder bumps 24 and an anisotropic conductive film (ACF) 26. Detailed cross-sectional views of an ACF 26 is shown in FIGS. 2A and 2B. As shown in FIG. 2A, a TAB tape 22 which has conductive pads 28 formed on top is positioned over an ACF tape 30 which contains electrically conductive particles 32 embedded an insulative compound 34. Positioned under the ACF 30 is a LCD substrate 10 which has conductive elements 36 formed on top. After the TAB tape 22, the ACF 30 and the LCD substrate 10 are pressed together under heat, as shown in FIG. 2B, the conductive particles 32 provides electrical communication between the conductive pads 28 and the conductive elements 36 and therefore allowing the TAB tape 22 to electrically communicate with the LCD substrate 10. It should be noted that, electrical communication between the conductive pads 28 and the conductive elements 26 is only established where the conductive particles 32 are compressed, i.e., only established anisotropically and selectively. The conductive elements 36 on the LCD substrate 10 is normally formed of indium-tin-oxide (ITO) thin films.

As shown in FIG. 1C, the COG technique may further connect the LCD substrate 10 to a printed circuit board (not shown) by a flexible printed circuit board (not shown). The COG technique therefore relies on bonding with solder bumps 24 formed on an IC chip and the ACF for electrical communications.

Each of the three conventional techniques for forming a TFT-LCD assembly has its benefits and disadvantages. For instance, in the first technique of using SMT/FPCB, the circuit density can be increased to achieve a compact package at the expense of using difficult TAB technology and high material costs. In the TAB and COG method, a rework of the assembly such as the removal of a defective IC from a LCD substrate is extremely difficult, if not impossible. For instance, the only possible means for removing an IC chip that is bonded to a LCD substrate is by using a shear force for pushing an IC chip and breaking its bond with the LCD substrate. This is a difficult process and frequently results in the destruction of the entire assembly.

In the present fabrication process for TFT-LCD assemblies, the SMT/FPCB method is frequently used in fabricating lower priced assemblies such as those utilizing small LCD panels. In large LCD panel applications, i.e., such as those used in notebook computers, the TAB bonding method is normally used. The COG method, due to its difficulty in reworking and repair, is also limited to small LCD panel display applications. The TAB process and the COG process are therefore the two major assembling methods used for TFT-LCD assemblies. To sum up, the TAB method can be easily reworked and repaired by removing an IC chip from the TAB tape and furthermore, it is compact in size which allows the achievement of high density packages of up to 60 µm pitch. However, the TAB process requires complicated fabrication steps which include IC bonding, tape fabrication, inner lead bonding, encapsulation, outer lead bonding and the ACF process. Another drawback for the TAB process is, during the ACF processing, there is a thermal expansion problem which may lead to misalignment between the leads. The TAB tape may further absorb moisture and contribute to its dimensional instability. Elaborate equipment may also be required for the TAB process and therefore increasing its fabrication costs.

Figure 3A:
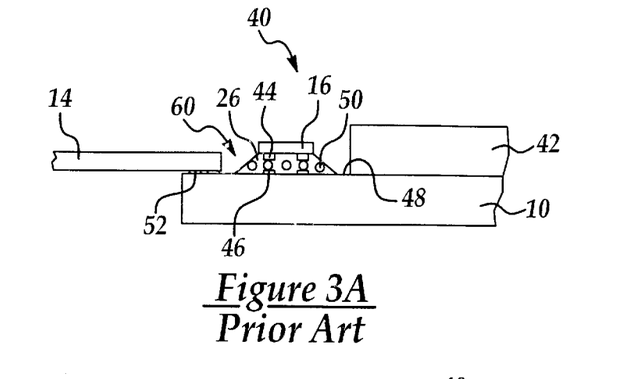
FIG. 3A is a cross-sectional view of a conventional bonding arrangement for a printed circuit board and a driver chip bonded to a liquid crystal display panel.
Figure 3B:
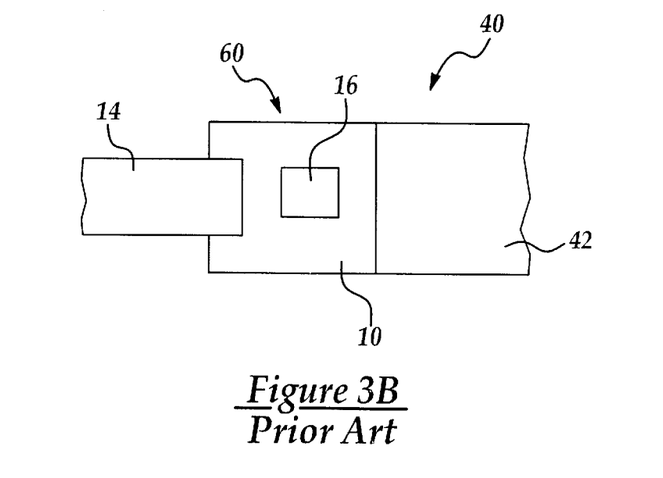
FIG. 3B is a plane view of the liquid crystal display panel bonded in FIG. 3A.

In the COG process, while the fabrication steps required are simpler, i.e. only IC bumping and ACF processes are required, and furthermore, there is no thermal expansion problem and smaller pitch such as 50 µm can be achieved, the fabrication of an LCD package of compact size is nevertheless difficult. This difficulty is illustrated in FIGS. 3A and 3B. In FIG. 3A, a cross-sectional view of an LCD package 40 which consists of an LCD substrate shown as a lower glass panel 10, an upper glass panel 42, an IC chip (or a driver chip) 16, an anisotropic conductive film (ACF) layer 26, and a printed circuit board (or a flexible printed circuit board) 14 is shown. The driver chip 16 is equipped with a multiplicity of solder bumps 44 formed on an active surface of the chip 16 for making electrical connection with a second multiplicity of conductive leads 46 (such as ITO leads) formed on the top surface 48 of the lower glass panel 10. The electrical communication is established by using the anisotropic conductive film layer 26 which is loaded with electrically conductive particles 50. In order to communicate with the outside circuits, such as circuits on the PCB 14, electrical communication through a third multiplicity of conductive pads 52 is provided between the PCB 14 and the lower glass panel 10. A plane view of the LCD package 40 is further shown in FIG. 3B.

As shown in FIGS. 3A and 3B, the lower glass panel 10 of the LCD package 40 is normally provided with a larger area than the upper glass panel 42 and thus leaving an exposed edge area 60 necessary for mounting of the driver chip 16 and the PCB 14. The excess edge portion 60 therefore cannot be reduced which results in excessively large LCD packages that are not suitable for certain applications that require a compact LCD package. The technology of connecting driver chips and external PCB circuits to an LCD package therefore must be improved in order to produce compact LCD panels.

Figure 4:
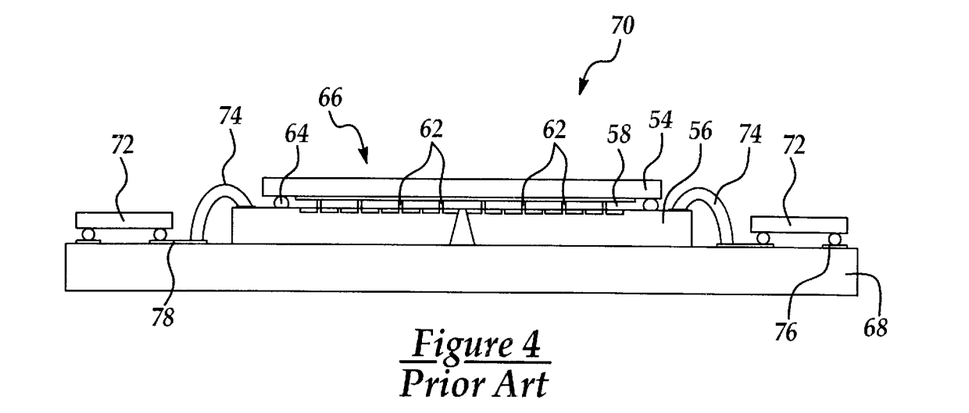
FIG. 4 is an enlarged, cross-sectional view of a conventional liquid crystal on silicon (LCoS) module.

More recently, a flat panel display package has been developed wherein one of the glass panels is replaced by a non-transparent panel such as a silicon substrate. The display module formed is known as a liquid crystal on silicon, or LCoS in abbreviation. In a typical liquid crystal on silicon module, the interconnection between the liquid crystal and a printed circuit board is by wire bonding or by an anisotropic conductive film (ACF) placed on silicon. A typical liquid crystal on silicon module 70 is shown in FIG. 4. The liquid crystal on silicon module 70 is constructed by a glass substrate 54 and a silicon substrate 56 with a liquid crystal material 58 filled therein-between. Spacers 62 are utilized to keep a constant space between the two substrates. An adhesive bead 64 is used along a perimeter of the glass substrate 54 for sealing and retaining the liquid crystal material 58. When the liquid crystal display panel 66 is used to interconnect to a substrate such as a printed circuit board 68, the silicon substrate 56 is adhesively bonded to the printed circuit board 68. IC chips 72 are mounted on top of the printed circuit board 68 for providing driver circuits to the liquid crystal panel 66. The electrical interconnections are thus made by wire bonds 74 between the liquid crystal panel 66 and the printed circuit board 68. Bond pads 76 and metal traces 78 are further provided for accomplishing such interconnections.

In the liquid crystal on substrate module 70 shown in FIG. 4, while the wire bonding technology has matured and can be used reliably in producing liquid crystal display modules in an automated process, the throughput of the process is low due to the time consuming wire bonding process. Other processing and design difficulties such as the module cannot be aligned in an existing alignment equipment which is designed for aligning modules that have a transparent base plate, or the poor heat dissipation since a heat sink cannot be directly attached to the silicon substrate. These processing and design limitations greatly limit the application potential of the liquid crystal on silicon modules.

It is therefore an object of the present invention to provide a method for interconnecting a flat display panel that has a non-transparent substrate without the drawbacks or shortcomings of the conventional interconnecting method.

It is another object of the present invention to provide a method for interconnecting a flat display panel that has a non-transparent substrate without using the wire bonding technique.

It is a further object of the present invention to provide a method for interconnecting a flat display panel that has a non-transparent substrate by using a glass panel that is larger than the non-transparent panel in forming the liquid crystal panel.

It is another further object of the present invention to provide a method for interconnecting a flat display panel that has a non-transparent substrate by utilizing anisotropic conductive film in interconnecting the liquid crystal panel to a printed circuit board.

It is still another object of the present invention to provide a method for interconnecting a flat display panel that has a non-transparent substrate to a flexible printed circuit board by utilizing an anisotropic conductive adhesive in-between the circuit board and the liquid crystal panel.

It is yet another object of the present invention to provide a flat display module formed by a flat panel electrically connected to a printed circuit board without any wire bonds.

It is still another further object of the present invention to provide a flat panel display module formed by a flat panel electrically connected to a printed circuit board by utilizing an anisotropic conductive film or an anisotropic conductive adhesive in-between the flat panel display and the printed circuit board.

It is yet another further object of the present invention to provide a flat panel display module formed by a flat panel electrically connected to a printed circuit board that can be processed in a conventional bonder and an alignment equipment.

SUMMARY OF THE INVENTION

In accordance with the present invention, a method for interconnecting a flat panel display that has a non-transparent substrate to a printed circuit board and a flat panel display module formed by such method are disclosed.

In a preferred embodiment, a method for interconnecting a flat display panel that has a non-transparent substrate can be carried out by the operating steps of first providing a flat display panel that is formed of a glass panel, a silicon substrate and a liquid crystal material filled therein-between; the glass panel has a length larger than a length of the silicon substrate resulting in an overhang on at least one side of the glass panel in a longitudinal direction; providing a multiplicity of metal leads on an edge portion of the silicon substrate not covered by the liquid crystal material in electrical communication with a multiplicity of thin film transistors; providing a multiplicity of transparent conductive traces on the overhang of the glass panel; providing a printed circuit board that has a multiplicity of conductive pads formed on an edge portion of the board; positioning the flat display panel with the glass panel facing downwardly and the silicon substrate juxtaposed to the PCB; positioning an electrically conductive adhesive in-between the multiplicity of transparent conductive traces, the multiplicity of metal leads, and the multiplicity of conductive pads; aligning the flat display panel to the PCB optically from an underside of the panel through the glass panel; and compressing the PCB against the overhang of the glass panel such that the multiplicity of conductive pads on the PCB is electrically connected to the multiplicity of metal leads on the edge portion of the silicon substrate through the multiplicity of transparent conductive traces on the glass panel and the electrically conductive adhesive positioned therein-between.

The method for interconnecting a flat display panel that has a non-transparent substrate may further include the step of curing the electrically conductive adhesive by UV radiation from the side of the glass panel, or the step of selecting an electrically conductive adhesive from the group consisting of silver paste, electrically conductive elastomer, anisotropic conductive film, anisotropic conductive adhesive, metal bumps and solder balls. The method may further include the step of providing a multiplicity of transparent conductive traces that is formed of indium-tin-oxide, or the step of providing a printed circuit board that is a flexible printed circuit board, or the step of aligning the flat panel display to the PCB optically by a charge coupled device (CCD).

The present invention is further directed to a method for simultaneously forming a flat display panel and bonding to a printed circuit board which can be carried out by the operating steps of providing a silicon wafer that has a multiplicity of thin film transistors each formed on a multiplicity of dies; coating and buffing an alignment layer of a polymeric material on top of the silicon wafer achieving a preferred orientation of the material; mounting a multiplicity of spacers each having a preset thickness on top of the wafer; singulating the multiplicity of dies from the wafer and testing for reliability; positioning a frame seal along a periphery of one of the multiplicity of dies; forming a multiplicity of metal leads on an edge portion of the die electrically connecting to a multiplicity of thin film transistors; positioning a glass plate that has a larger area than the die resulting in an overhang on the die; forming a multiplicity of transparent conductive traces in the overhang on the die; providing a printed circuit board that has a multiplicity of conductive pads formed on an edge portion of the board; positioning the die and the glass plate with the frame seal therein-between in an upside-down position with the glass plate facing downwardly and the die juxtaposed to the PCB; positioning an electrically conductive material in-between the multiplicity of transparent conductive traces and the multiplicity of metal leads, the multiplicity of conductive pads; aligning the glass plate to the die and the PCB from an underside of the glass panel; compressing the PCB against the overhang of the glass plate such that the multiplicity of conductive pads on the PCB is electrically connected to the multiplicity of metal leads on the die through the multiplicity of transparent conductive traces on the glass plate and the electrically conductive material positioned therein-between; and filling a liquid crystal material between the glass plate and the die contained by the frame seal.

The method for simultaneously forming a flat display panel and bonding to a printed circuit board may further include the step of annealing the electrically conductive material by UV radiation applied from the side of the glass plate, or the step of providing the printed circuit board in a flexible printed circuit or the step of aligning the glass plate to the die and the PCB by a charge coupled device. The method may further include the step of compressing the PCB against the overhang of the glass plate between an upper platen and the glass plate, or the step of mounting a heat sink to the die for enhanced heat dissipation, or the step of providing the frame seal in a UV curable polymeric material. The method may further include the step of selecting the electrically conductive material from the group consisting of silver paste, electrically conductive elastomer, anisotropic conductive film, anisotropic conductive adhesive, metal bumps and solder balls.

The present invention is still further directed to a flat panel display (FPD) module formed by a flat panel electrically connected to a printed circuit board that includes a flat panel formed of a glass plate, a silicon substrate and a liquid crystal material filled therein-between, the glass plate has a length larger than a length of the silicon substrate resulting in an overhang on at least one side of the glass plate in a longitudinal direction; a multiplicity of metal leads on an edge portion of the silicon substrate not covered by the liquid crystal material in electrical communication with a multiplicity of thin film transistors; a multiplicity of transparent conductive traces on the overhang of the glass plate; and a printed circuit board that has a multiplicity of conductive pads formed on an edge portion of the board; the flat panel with the glass plate facing downwardly and the silicon substrate juxtaposed to the PCB is bonded to the PCB by an electrically conductive material placed in-between the multiplicity of transparent conductive traces, the multiplicity of metal leads, and the multiplicity of conductive pads; such that the multiplicity of conductive pads on the PCB is electrically connected to the multiplicity of metal leads on the edge portion of the silicon substrate through the multiplicity of transparent conductive traces on the glass plate and the electrically conductive material.

In the flat panel display module formed by a flat panel electrically connected to a printed circuit board, the multiplicity of transparent conductive traces may be formed of indium-tin-oxide (ITO). The electrically conductive material for bonding the flat panel to the PCB may be selected from the group consisting of silver paste, electrically conductive elastomer, anisotropic conductive film, anisotropic conductive adhesive, metal bumps and solder balls. The printed circuit board may be a flexible printed circuit. The electrically conductive material may be a UV curable material. The flat panel display module may further include a heat sink that is mounted to the silicon substrate for enhanced heat dissipation.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for interconnecting a flat display panel to a printed circuit board wherein the display panel has a non-transparent substrate and a flat panel display module formed by the method.

The present invention novel method enables the use of existing bonder equipment and alignment equipment of the CCD (charge coupled device) type since a glass substrate is used in the LCoS module. The present invention novel construction further allows an adhesive used in bonding the liquid crystal panel to the printed circuit board to be cured by UV light transmitted through the transparent glass substrate. A further benefit made possible by the present invention novel construction is the availability of a heat sink to be mounted directly to the silicon substrate which is completely exposed and not covered by a circuit board.

In the present invention novel structure, a multiplicity of signal lines or metal leads on the silicon substrate can be extended to the signal lines on a glass substrate through the use of an electrically conductive material such as silver paste, electrically conductive elastomer, anisotropic conductive film and anisotropic conductive adhesive. The conductive material enables the bonding between the glass plate and a printed circuit board, or a flexible printed circuit to form a flat panel display module. The electrically conductive material can be applied to the silicon substrate by a dispensing means for a material such as silver paste or an anisotropic conductive adhesive; by a mechanical means for a material such as an electrically conductive elastomer; by an adhesive means such as for an anisotropic conductive film; or by a bumping means for the metal bumps, or by a stencil printing means for the solder balls. These processes can be carried out before a sealant, or a frame seal, is applied onto the glass substrate. The various electrically conductive materials can be applied on top of the transparent conductive traces, i.e. ITO electrodes that are provided on the glass plate. By using an existing alignment equipment such as a CCD apparatus through the transparent glass plate to ensure the alignment between the glass plate and the silicon substrate, the flat panel display can be formed simultaneously during a bonding process for the printed circuit board.

The present invention provides numerous processing advantages including one of using the well-established technology of anisotropic conductive films to bond a printed circuit board or a flexible printed circuit to a glass plate. The present invention method utilizes existing equipment such as an alignment apparatus by CCD through a glass plate. The use of a new equipment for aligning through a non-transparent substrate which is extremely expensive is thus not necessary. The present invention method can be equally applicable to applications other than silicon substrates, for instance, for GaAs substrate, for ceramic substrates, for printed circuit boards, for plastic boards, or for other non-transparent flexible films. Moreover, the present invention novel structure allows the backside of a silicon substrate to be completely exposed and therefore easily adapted for mounting a heat sink thereto.

Figure 5:
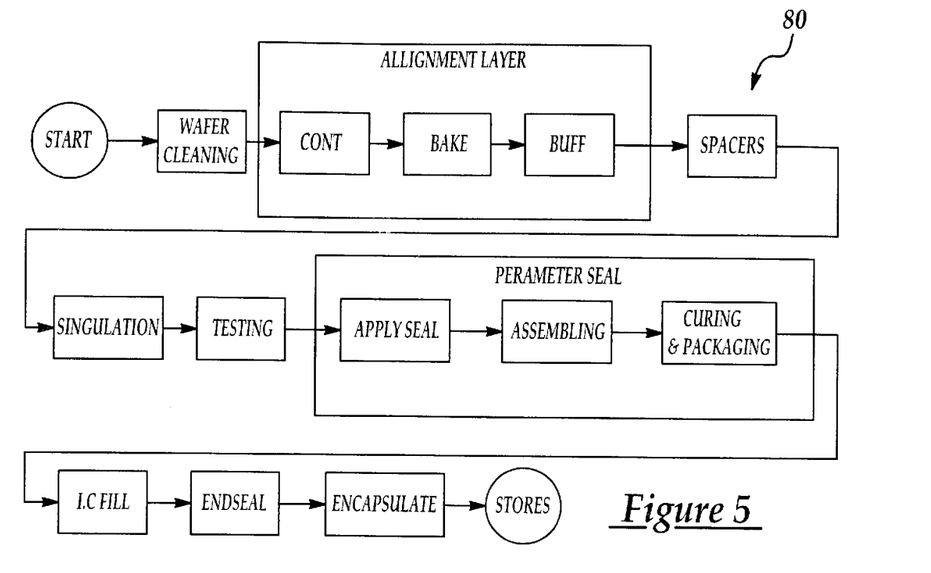
FIG. 5 is a block diagram illustrating the process flow of the present invention method.

Referring now to FIG. 5, wherein a block diagram 80 for the present invention novel method is shown. In the method, a wafer that has a multiplicity of dies formed thereon each having a multiplicity of thin film transistors formed thereon is supplied and cleaned. An alignment layer coating, such as a polyimide material, is then coated on top of the wafer surface, baked for curing and then buffed to achieve a desirable orientation in the layer. The alignment layer is provided such that a subsequently applied liquid crystal material can follow the orientation of the alignment layer. A multiplicity of spacers is then mounted to the silicon wafer prior to the multiplicity of dies being singulated from the wafer. The multiplicity of dies is then tested for reliability and quality control purposes. After a die has passed such functioning test, a seal or a frame seal is applied around the perimeter of the die and a top glass plate is assembled to the silicon substrate by pressing on the glass plate onto the frame seal. Simultaneously, a conductive material is applied in-between the glass plate and the printed circuit board for bonding the glass plate to the printed circuit board and thus forming the module. A liquid crystal material is then filled into the cavity formed between the glass plate and the silicon substrate, and then the fill port is sealed to contain the liquid crystal material. Finally, the module is encapsulated and stored for use in assembling an electronic device.

Figure 6:
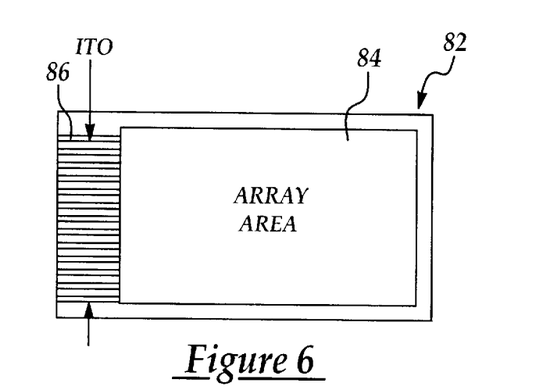
FIG. 6 is an enlarged, plane view of the present invention silicon substrate with a multiplicity of metal leads formed on a top surface.

A plane view of a silicon substrate 82 utilized in the present invention novel structure is shown in FIG. 6. On top of the silicon substrate 82, is an array area for the thin film transistors that are used to drive the liquid crystal panel formed on top. On one side of the silicon substrate 82, is provided a multiplicity of metal leads 86 for providing electrical communication with the multiplicity of thin film transistors (not shown) formed on the silicon substrate.

Figure 7:
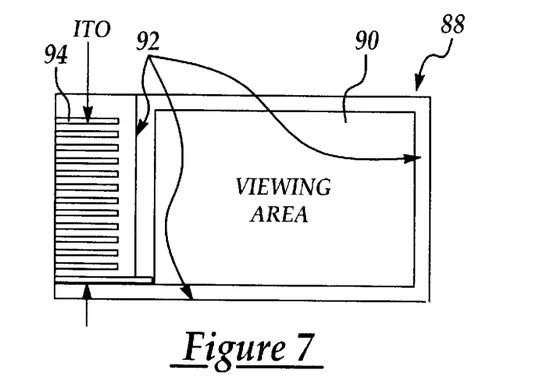
FIG. 7 is an enlarged, plane view of the present invention glass substrate that has a multiplicity of transparent conductive traces formed on top.

A similar view for the glass substrate 88 which has a larger length than the silicon substrate 82 is shown in FIG. 7. On top of the glass substrate is an area 90, similar in size to the array area 84 of FIG. 6, for forming the liquid crystal panel within a frame seal 92 placed around the perimeter of the LCD viewing area 90. On one end of the glass substrate 88, is provided a multiplicity of transparent conductive traces 94 formed of indium-tin-oxide. The transparent ITO electrodes 94 are provided such that the transparency of the glass substrate 88 is not disturbed in any way during a CCD alignment procedure when light is transmitted from the bottom of the glass substrate 88 upwardly into the module. This is shown in FIG. 8.

Figure 8:
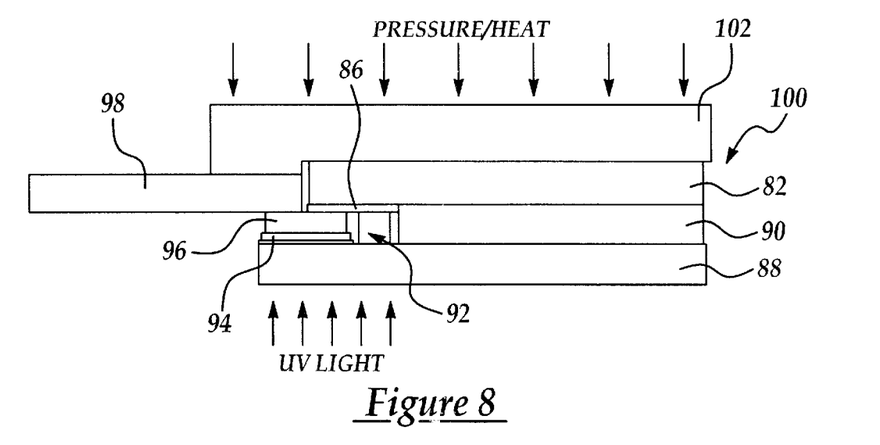
FIG. 8 is an enlarged, cross-sectional view of a process for bonding the present invention liquid crystal panel to a printed circuit board without using wire bonds.

As shown in FIG. 8, a present invention flat panel display module 100 is formed by a silicon substrate 82, a glass substrate 88, and a liquid crystal material 90 filled therein-between and retained by a frame seal 92, i.e. a sealing adhesive for bonding the two substrates together. On top of the silicon substrate, is provided a multiplicity of metal leads 86, also shown in FIG. 6. On top of the glass substrate 88, is provided a multiplicity of transparent conductive traces 94, or ITO traces. The transparent conductive traces 94 are utilized such that the transparency of the glass substrate 88 is not disturbed in any way so that the flat panel display module 100, during its assembly, can be optically aligned from the side of the glass substrate by using a conventional alignment apparatus of CCD.

A further benefit achieved by the present invention novel structure of the flat panel display module 100 is that the conductive material 96 utilized in bonding the printed circuit board 98, the glass substrate 88 and the silicon substrate 82 together can be cured by an optical means, such as by UV radiation. The conductive material 96 can be suitably selected from the group consisting of silver paste, electrically conductive elastomer, anisotropic conductive film, anisotropic conductive adhesive, metal bumps and solder balls. In-between the glass substrate 88 and the silicon substrate 82, a suitable conductive material to be used may be selected from silver paste, electrically conductive elastomer, anisotropic conductive film, or an isotropic conductive adhesive. It is seen that the metal bumps and the solder balls are more suitably utilized in-between the printed circuit board 98 and the glass substrate 88.

Figure 9:
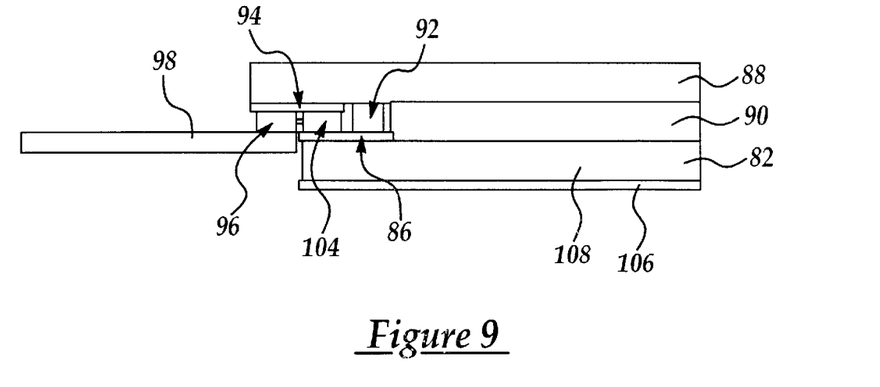
FIG. 9 is an enlarged, cross-sectional view of the present invention liquid crystal panel bonded to a printed circuit board and a heat sink.

FIG. 9 illustrates the present invention flat panel display module 100 after the upper mold platen 102 is removed subsequent to a compression bonding process. Also shown in FIG. 9, is a heat sink 106 that can be advantageously bonded to the backside 108 of the silicon substrate 82 for achieving enhanced heat dissipation. It should be noted that such mounting of the heat sink 106 is only made possible in the present invention novel structure since the backside 108 of the silicon substrate 82 is completely exposed when compared to the conventional structure shown in FIG. 4. The present invention novel structure therefore allows an electrical connection between a multiplicity of metal leads 86 on the silicon substrate 82 to be made to a printed circuit board 98 through conductive material 96,104 and through a multiplicity of transparent electrodes 94 formed on the glass substrate 88. The electrical communications are established without causing any problem in the alignment process when a CCD apparatus is used on the underside of the glass substrate 88, as shown in FIG. 8, during the assembly process of the flat panel display module 100 and the printed circuit board 98.

The present invention therefore provides a method for simultaneously forming a frame seal of the flat panel display and bonding to a printed circuit board in a single compression assembling process in the same bonder apparatus, while the alignment of the various components can be advantageously made by an optical means such as a CCD from the underside of the glass substrate.

The present invention novel method for interconnecting a flat display panel that has a non-transparent substrate to a printed circuit board and the flat panel display module formed by the method have therefore been amply described in the above description and in the appended drawings of FIGS. 5–9.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for interconnecting a flat display panel having a non-transparent substrate comprising the steps of:
   providing a flat display panel formed of a glass panel, a silicon substrate and a liquid crystal material filled therein-between; said glass panel having a length larger than a length of said silicon substrate resulting in an overhang on at least one side of said glass panel in a longitudinal direction;
   providing a multiplicity of metal leads on an edge portion of said silicon substrate not covered by said liquid crystal material in electrical communication with a multiplicity of thin film transistors;
   providing a multiplicity of transparent conductive traces on said overhang of said glass panel;
   providing a printed circuit board (PCB) having a multiplicity of conductive pads formed on an edge portion of the board;
   positioning said flat display panel with said glass panel facing downwardly and said silicon substrate juxtaposed to said PCB;
   positioning an electrically conductive adhesive in-between said multiplicity of transparent conductive traces and said multiplicity of metal leads, said multiplicity of conductive pads;
   aligning said flat display panel to said PCB optically from an underside of said panel through said glass panel; and
   compressing said PCB against said overhang of said glass panel such that said multiplicity of conductive pads on said PCB is electrically connected to said multiplicity of metal leads on said edge portion of the silicon substrate through said multiplicity of transparent conductive traces on said glass panel and said electrically conductive adhesive positioned therein-between.

2. A method for interconnecting a flat display panel having a non-transparent substrate according to claim 1 further comprising the step of curing said electrically conductive adhesive by UV radiation from the side of the glass panel.

3. A method for interconnecting a flat display panel having a non-transparent substrate according to claim 1 further comprising the step of selecting an electrically conductive adhesive from the group consisting of silver paste, electrically conductive elastomer, anisotropic conductive film, anisotropic conductive adhesive, metal bumps and solder balls.

4. A method for interconnecting a flat display panel having a non-transparent substrate according to claim 1 further comprising the step of providing a multiplicity of transparent conductive traces that is formed of indium-tin-oxide.

5. A method for interconnecting a flat display panel having a non-transparent substrate according to claim 1 further comprising the step of providing a printed circuit board that is a flexible printed circuit board.

6. A method for interconnecting a flat display panel having a non-transparent substrate according to claim 1 further comprising the step of aligning said flat panel display to said PCB optically by a charge coupled device (CCD).

7. A method for simultaneously forming a flat display panel and bonding to a printed circuit board comprising the steps of:
   providing a silicon wafer having a multiplicity of thin film transistors each formed on a multiplicity of dies;
   coating and buffing an alignment layer of a polymeric material on top of said silicon wafer achieving a preferred orientation of said layer;
   mounting a multiplicity of spacers each having a preset thickness on top of said wafer;
   singulating said multiplicity of dies from said wafer and testing for reliability;
   positioning a frame seal along a periphery of one of said multiplicity of dies;
   forming a multiplicity of metal leads on an edge portion of said die electrically connecting to a multiplicity of thin film transistors;

positioning a glass plate having a larger area than said die resulting in an overhang on said die;

forming a multiplicity of transparent conductive traces in said overhang on said die;

providing a printed circuit board (PCB) having a multiplicity of conductive pads formed on an edge portion of the board;

positioning said die and said glass plate with said frame seal therein-between in an upside-down position with said glass plate facing downwardly and said die juxtaposed to said PCB;

positioning an electrically conductive material in-between said multiplicity of transparent conductive traces and said multiplicity of metal leads, said multiplicity of conductive pads;

aligning said glass plate to said die and said PCB from an underside of said glass panel;

compressing said PCB against said overhang of said glass plate such that said multiplicity of conductive pads on said PCB is electrically connected to said multiplicity of metal leads on said die through said multiplicity of transparent conductive traces on said glass plate and said electrically conductive material positioned therein-between; and filling a liquid crystal material between said glass plate and said die contained by said frame seal.

8. A method for simultaneously forming a flat display panel and bonding to a printed circuit board according to claim 7 further comprising the step of annealing said electrically conductive material by UV radiation applied from the side of the glass plate.

9. A method for simultaneously forming a flat display panel and bonding to a printed circuit board according to claim 7 further comprising the step of providing said printed circuit board in a flexible printed circuit board (FPC).

10. A method for simultaneously forming a flat display panel and bonding to a printed circuit board according to claim 7 further comprising the step of aligning said glass plate to said die and said PCB by a charge coupled device (CCD).

11. A method for simultaneously forming a flat display panel and bonding to a printed circuit board according to claim 7 further comprising the step of compressing said PCB against said overhang of said glass plate between an upper platen and said glass plate.

12. A method for simultaneously forming a flat display panel and bonding to a printed circuit board according to claim 7 further comprising the step of mounting a heat sink to the die for enhanced heat dissipation.

13. A method for simultaneously forming a flat display panel and bonding to a printed circuit board according to claim 7 further comprising the step of providing said frame seal in a UV curable polymeric material.

14. A method for simultaneously forming a flat display panel and bonding to a printed circuit board according to claim 7 further comprising the step of selecting said electrically conductive material from the group consisting of silver paste, electrically conductive elastomer, anisotropic conductive film, anisotropic conductive adhesive, metal bumps and solder balls.

15. A flat panel display (FPD) module formed by a flat panel electrically connected to a printed circuit board (PCB) comprising:

a flat panel formed of a glass plate, a silicon substrate and a liquid crystal material filled therein-between; said glass plate having a length larger than a length of said silicon substrate resulting in an overhang on at least one side of said glass plate in a longitudinal direction;

a multiplicity of metal leads on an edge portion of said silicon substrate not covered by said liquid crystal material in electrical communication with a multiplicity of thin film transistors;

a multiplicity of transparent conductive traces on said overhang of said glass plate; and a printed circuit board (PCB) having a multiplicity of conductive pads formed on an edge portion of the board;

said flat panel with said glass plate facing downwardly and said silicon substrate juxtaposed to said PCB being bonded to said PCB by an electrically conductive material placed in-between said multiplicity of transparent conductive traces and said multiplicity of metal leads, said multiplicity of conductive pads; such that said multiplicity of conductive pads on said PCB is electrically connected to said multiplicity of metal leads on said edge portion of the silicon substrate through said multiplicity of transparent conductive traces on said glass plate and said electrically conductive material.

16. A flat panel display module formed by a flat panel electrically connected to a printed circuit board according to claim 15, wherein said multiplicity of transparent conductive traces are formed of indium-tin-oxide.

17. A flat panel display module formed by a flat panel electrically connected to a printed circuit board according to claim 15, wherein said electrically conductive material for bonding said flat panel to said PCB is selected from the group consisting of silver paste, electrically conductive elastomer, anisotropic conductive film, anisotropic conductive adhesive, metal bumps and solder balls.

18. A flat panel display module formed by a flat panel electrically connected to a printed circuit board according to claim 15, wherein said printed circuit board is a flexible printed circuit board.

19. A flat panel display module formed by a flat panel electrically connected to a printed circuit board according to claim 15, wherein said electrically conductive material is a UV curable material.

20. A flat panel display module formed by a flat panel electrically connected to a printed circuit board according to claim 15 further comprising a heat sink mounted to the silicon substrate for enhanced heat dissipation.

* * * * *